United States Patent [19]
Froberg et al.

[11] Patent Number: 5,521,738
[45] Date of Patent: May 28, 1996

[54] DATA ENCODED OPTICAL PULSE GENERATOR

[75] Inventors: Nan M. Froberg, Metuchen; Alan Gnauck, Middletown; Per B. Hansen, Bradley Beach; George T. Harvey, Princeton; Gregory Raybon, Leonardo, all of N.J.

[73] Assignee: AT&T Corp., Murray Hill, N.J.

[21] Appl. No.: 268,394

[22] Filed: Jun. 30, 1994

[51] Int. Cl.$^6$ .................................................. H04B 10/04
[52] U.S. Cl. .......................... 359/184; 359/180; 359/181; 359/185; 372/38
[58] Field of Search .................................. 359/184, 185, 359/180, 181; 372/38, 50, 96

[56] References Cited

U.S. PATENT DOCUMENTS

| | | | |
|---|---|---|---|
| 4,558,449 | 12/1985 | Gordon | 372/44 |
| 5,033,114 | 6/1991 | Jayaraman et al. | 359/110 |
| 5,099,471 | 3/1992 | Tsukada et al. | 359/184 |
| 5,305,336 | 4/1994 | Adar et al. | 372/96 |
| 5,305,343 | 4/1994 | Allovon et al. | 372/50 |
| 5,311,351 | 5/1994 | Chesnoy | 359/184 |
| 5,317,581 | 5/1994 | Onishi et al. | 372/38 |
| 5,325,392 | 6/1994 | Tohmori et al. | 372/50 |
| 5,335,107 | 8/1994 | Georges et al. | 359/184 |
| 5,343,324 | 8/1994 | Le et al. | 359/184 |

FOREIGN PATENT DOCUMENTS

| | | | |
|---|---|---|---|
| 4-00420 | 4/1992 | Japan | 359/185 |

OTHER PUBLICATIONS

Gain–Switching of DBR Laser Monolithically Integrated with Electroabsorption Modulator for RZ Transmission, *Electronics Letters*, vol. 28, No. 2, Jan. 16, 1992.

Transform–Limited 14ps Optical Pulse Generation with 15 GHz Repetition Rate by InGaAsP Electroabsorption Modulator, *Electronics Letters*, vol. 28, No. 11, May 21, 1992.

Transform–Limited 7–ps Optical Pulse Generation Using a Sinusoidally Driven InGaAsP/InGaAsP Strained Multiple–Quantum–Well DFB Laser/Modulator Monolithically Integrated Light Source, *IEEE Photonics Technology Letters*, vol. 5, No. 8, Aug., 1993.

Optical Pulse Generation with High Repetition Rate by Sinusoidally–Driven InGaAs/InAlAs Multiquantum Well Modulator, *Electronics Letters*, vol. 29, No. 8, Apr. 15, 1993.

Application of a λ/4–Shifted DFB Laser/Electrobsorption Modulator Monolithically Integrated Light Source to Single–Ship Pulse Generator with Varible Repetition Rate, *IEEE Technology Letters*, vol. 4, No. 10, Oct., 1992.

4.5 Gbit/s Modelocked Extended–Cavity Laser with a Monolithically Integrated Electroabsorption Modulator, *Electronics Letters*, vol. 29. No. 7 Apr. 1, 1993.

A DBR Laser Tunable by Resistive Heating, *IEEE Technology Letters*, vol. 4, No. 12, Dec., 1992.

A Multi–Section Electroabsorption Modulator Integrated DFB Laser for Optical Pulse Generation and Modulation, presented in the European Conference in Optical Communications, Sep., 1993 in Montraux, Switzerland.

*Primary Examiner*—Leo Boudreau
*Assistant Examiner*—Bhavesh Mehta

[57] ABSTRACT

The apparatus and method according to the present invention includes a semiconductor laser-modulator which is used to simultaneously generate optical pulses and encode data. The optical data output from the laser-modulator are soliton pulses in RZ format suitable for transmission in long distance optical communications.

8 Claims, 7 Drawing Sheets

TIME (50 ps/div)

OPTICAL FREQUENCY (2.5 GHz/div)

DATA ENCODED OPTICAL PULSE GENERATOR

BACKGROUND OF THE INVENTION

1. Technical Field

This invention relates generally to an optical pulse generator and more particularly to a data encoded optical pulse generator for generating soliton pulses.

2. Discussion of Related Art

A useful measure of the performance characteristics of a digital optical data communication system is the well-known "rate-length product", i.e., the product of the system data rate and the length of transmission. It is often a design goal to achieve the highest data rate through the longest repeaterless length and consequently the highest rate-length product.

Components used in long distance optical data communication systems for producing a high rate-length product typically include: a light source such as a laser diode; a high speed modulator which modulates the light source at the system bit rate, usually by amplitude modulating the light produced by the laser; a low loss, low dispersion fiber medium; a photodetector such as a p-i-n photodiode or an avalanche photodiode having a high speed response for detecting the transmitted optical signals; and a receiver coupled to the photodetector for amplifying and decoding the received optical signals. Components such as optical amplifiers and repeaters can further extend the transmission length and increase the rate-length product.

The system rate-length product is a function of the transmission format as well as of the hardware components used. In current optical communication systems, data is transmitted in non-return-to-zero (NRZ) format, with ones and zeros represented by the presence or absence of light in a given time slot. This format is typically implemented by using a laser to generate a CW light beam, then modulating the light beam with an electro-optic modulator. The modulator may be a separate semiconductor device. Recently, the laser and modulator have been fabricated on a single chip, resulting in an integrated transmitter for NRZ communications systems.

The rate-length product attainable with the NRZ transmission format is ultimately limited by dispersion in the optical fiber. To reach very high data rates, communications links employing soliton pulses have been proposed. Solitons are optical pulses which take advantage of the nonlinearity of the fiber to maintain pulse shape during transmission. Soliton pulses can be transmitter over long lengths of fiber at rates of 10 Gb/s and higher. The soliton pulse width is less than the width of the time slot and is thus transmitted in return to zero (RZ) format; i.e., the amplitude of the light returns to zero during each time slot. An RZ format is also desirable for systems employing optical time-division-multiplexing and demultiplexing.

Despite recent advances in the development of optical transmitters, a need exists for a transmitter which produces soliton pulses and is wavelength tunable, compact, manufacturable and relatively inexpensive to operate for producing RZ encoded data. One approach is to use a gain-switched laser to generate pulses, then encode data onto the pulses with a modulator. However, gainswitching produces chirp, which causes significant penalties in transmission due to fiber dispersion, and may also degrade the performance of a soliton system. Another approach is to use a mode-locked laser to generate pulses and again encode data with a modulator. However, monolithic mode-locked lasers operate only at fixed frequencies which are determined by their cavity length. The fabrication of devices with a desired operating frequency may be difficult, especially if the laser is to be integrated with the modulator for data encoding. External-cavity mode-locked lasers offer more flexibility in operation frequency, but are bulky and sensitive to the environment, making them unsuitable for practical applications.

Integrated laser-modulators previously suitable for NRZ data transmitters can be operated as transmitters for producing soliton pulses. In such case the laser is operated CW and the modulator is driven with an RF sinusoid, resulting in a time-varying transmission which converts the CW laser light to pulses. This type of pulse source is simple, compact, frequency and wavelength tunable, and possesses spectral characteristics suitable for long distance transmissions. A soliton transmitter based on this pulse source, consisting of a laser integrated with two modulators, has been demonstrated. In this approach, the first modulator is used to convert CW laser light to pulses and the second modulator is used to encode data. While this technique is attractive, the integration of a laser and two modulators requiring two high-speed contacts is difficult. A simpler device would be preferable.

SUMMARY OF THE INVENTION

Briefly, according to the present invention, an optical pulse generator, preferably an integrated semiconductor laser-modulator is used to simultaneously generate pulses and encode data in RZ format, eliminating the need for an external modulator and reducing cost, bulk and complexity. The laser is preferably of the Distributed Bragg Reflector (DBR) type and the laser-modulator is variable in pulse width, repetition rate and wavelength.

In a preferred embodiment, the apparatus according to the present invention comprises: a semiconductor laser and a semiconductor modulator, the laser for providing an optical signal source, the modulator for modulating the optical signal source; means for biasing the laser with a constant current and electrical data pulses to the laser to produce optical data pulses; and means for biasing the modulator with a constant voltage and applying a periodic analog, electrical signal, for example, a sinusoid to the modulator to further modulate the optical data pulses from the laser for outputting the encoded optical pulses.

The electrical data pulses applied to the laser may be in non-return-to-zero format. The bit rate of the data pulses and the analog signal applied to the modulator may be selectively variable in repetition rate. The encoded optical data output from the semiconductor laser-modulator are in return-to-zero format. The semiconductor laser-modulator further includes means for selectively varying the wavelength of the encoded optical pulses. Preferably, the means for varying the output wavelength is by use of a surface layer resistor which may be heated for selectively varying the temperature within the semiconductor laser.

According to another embodiment of the present invention, the apparatus comprises: a semiconductor laser and a modulator, the laser for providing an optical source, the modulator for modulating the optical source; means for biasing the laser sufficient to produce a CW optical output; means for applying electrical data pulses to the modulator to modulate the CW optical output to produce optical data pulses corresponding to the electrical data pulses.

The electrical data pulses applied to the modulator are in return-to-zero format and the optical data pulses output from the laser-modulator are also in return-to-zero format. The means for applying electrical data pulses to the modulator section includes a device for performing a gating operation of an NRZ data input with a periodic analog signal input to provide electrical RZ data pulses.

The present invention is also directed to a method for generating soliton pulses from a semiconductor device having a laser and a modulator, comprising the steps of: biasing the laser with a constant current at near lasing threshold; applying electrical data pulses at a selected bit rate to the laser for producing optical data pulses; reverse biasing the modulator by a constant voltage source; and applying to the modulator a sinusoidal source having a frequency corresponding to said bit rate.

According to another method of the invention for generating soliton pulses from a semiconductor laser and a modulator, the laser is biased for producing a CW laser output, and an electrical RZ data signal is applied to the modulator for transmitting said laser output when an electrical one is present for generating RZ optical data pulses corresponding to said RZ data signal.

BRIEF DESCRIPTION OF THE DRAWINGS

The features and advantages of the invention may be better understood from the following detailed description when read in conjunction with the following drawings.

DETAILED DESCRIPTION OF THE PREFERRED EMBODIMENTS

Figure 1:
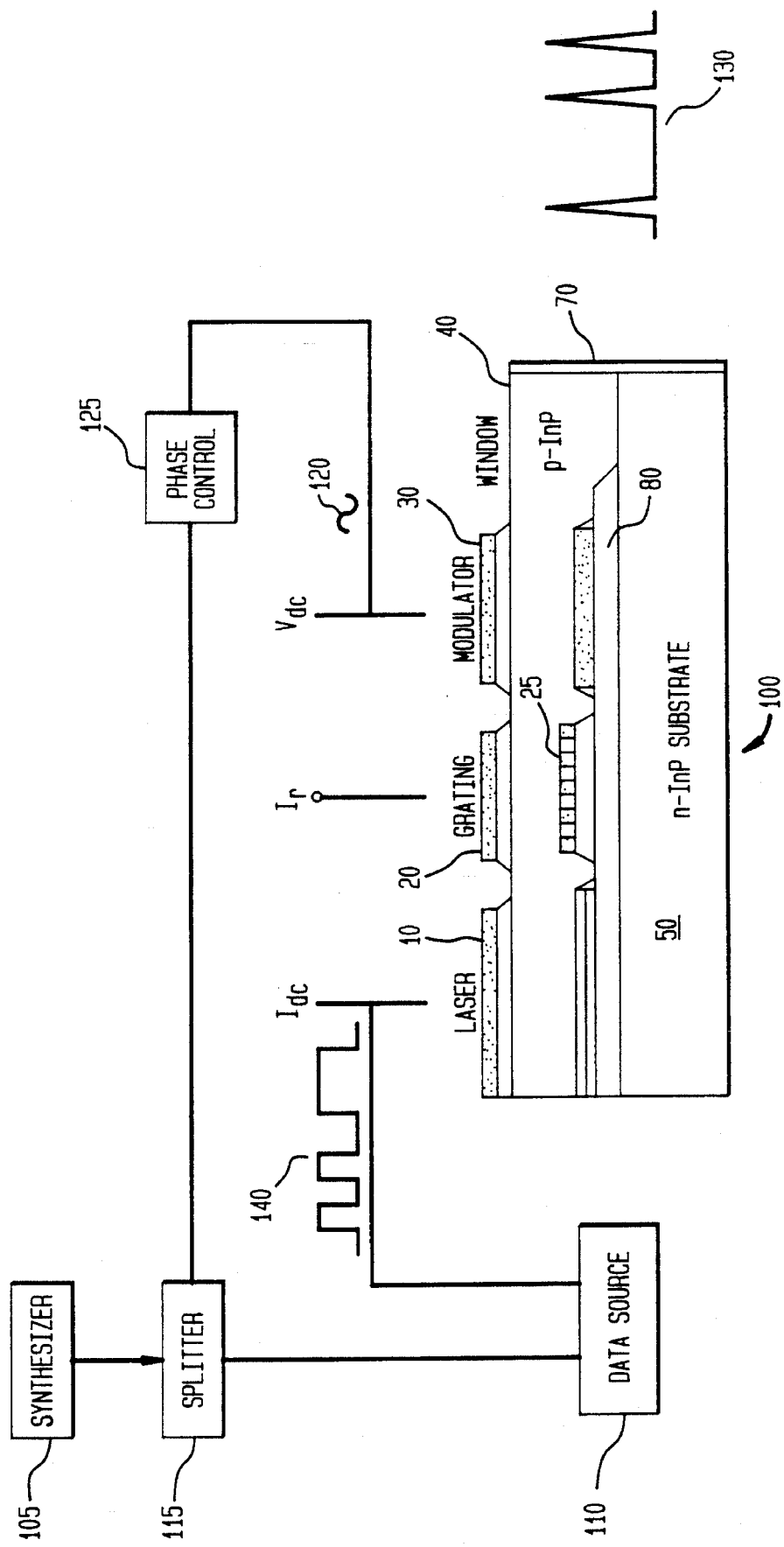
FIG. 1 is a schematic of the apparatus according to a preferred embodiment of the present invention.

Referring to FIG. 1, which shows a view of a data encoded optical pulse generator according to a preferred embodiment of the present invention. A semiconductor device 100 preferably includes a bulk electroabsorption modulator and a multiple quantum well Distributed Bragg Reflector (DBR) laser. The device 100 may be fabricated conventionally, and it is apparent to one ordinarily skilled in the art that the techniques of the present invention for generating data encoded optical pulses are also applicable to pulse generators having a semiconductor laser and an external modulator.

The DBR laser 10 is preferably operated to output pulses at around 1557 um wavelength but is discretely tunable over discrete wavelengths from around 1557 um to 1563 um. Laser wavelength tuning can be by carrier injection or by surface layer resistive heating. Both techniques employ the known principle that the wavelength of a semiconductor laser will change with temperature since its refractive index varies with temperature. The tuning capability of the DBR laser according to the present invention is preferably by surface layer resistive heating of a 220 ohm resistor 20 made on the top metalization layer over the grating region 25. Current IR is selectively applied to resistor 20 for selectively varying the temperature of the device and tune the optical output wavelength.

According to a preferred embodiment of the present invention the laser/modulator 100 is biased to output encoded optical data pulses in RZ format 130.

As shown in FIG. 1, data pulses are generated by biasing the laser section 10 at near lasing threshold with a constant current Idc and applying digital data from data source 110. The digital data is preferably in NRZ format. The output of the laser 10 is an optical signal corresponding to the electrical signal 140. The modulator 30 is then biased with a constant voltage source Vdc and an analog signal 120 is also applied. The modulator 30 further modulates the laser output. The resultant pulses 130 output from the laser/modulator 100 are in RZ format as shown. The analog signal 120 and the clock for the data source 110 originate from synthesizer 105, which is a high speed oscillator. For illustration, the synthesizer 105 operates at around 2.5 Ghz for the present preferred embodiment. The output of the synthesizer 105 is split by splitter 115 for providing the clock input to the data source 110 and to a phase control 125 for varying the phase of the analog signal 120.

Figure 2:
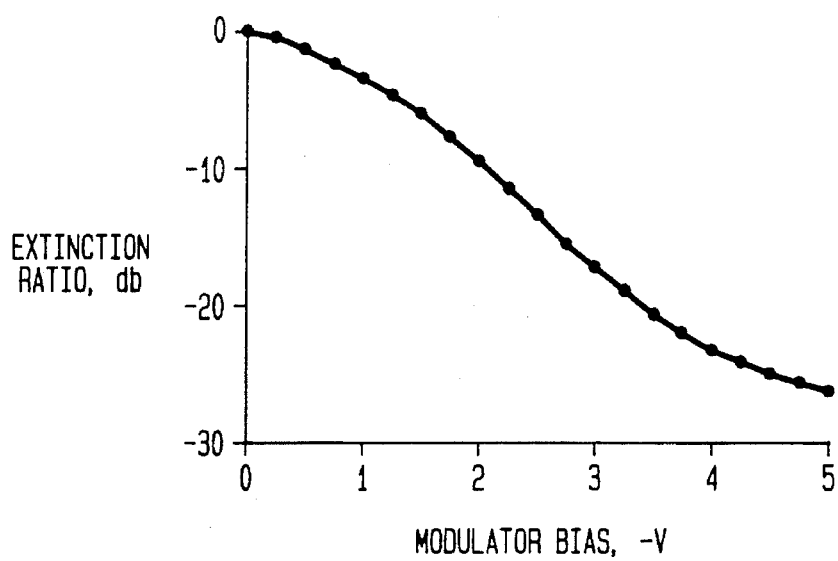
FIG. 2 shows the absorption characteristics of the modulator as a graph of voltage bias versus extinction ratio.

FIG. 2 shows the measured absorption characteristic for the modulator 30. For example, the DC extinction is 25 dB for a reverse bias of −4.5 V. By biasing the modulator near full extinction and applying a sinusoidal voltage which temporarily reduces the attenuation, the modulator generates picosecond pulses in a range limited only by its frequency response.

Figure 3:
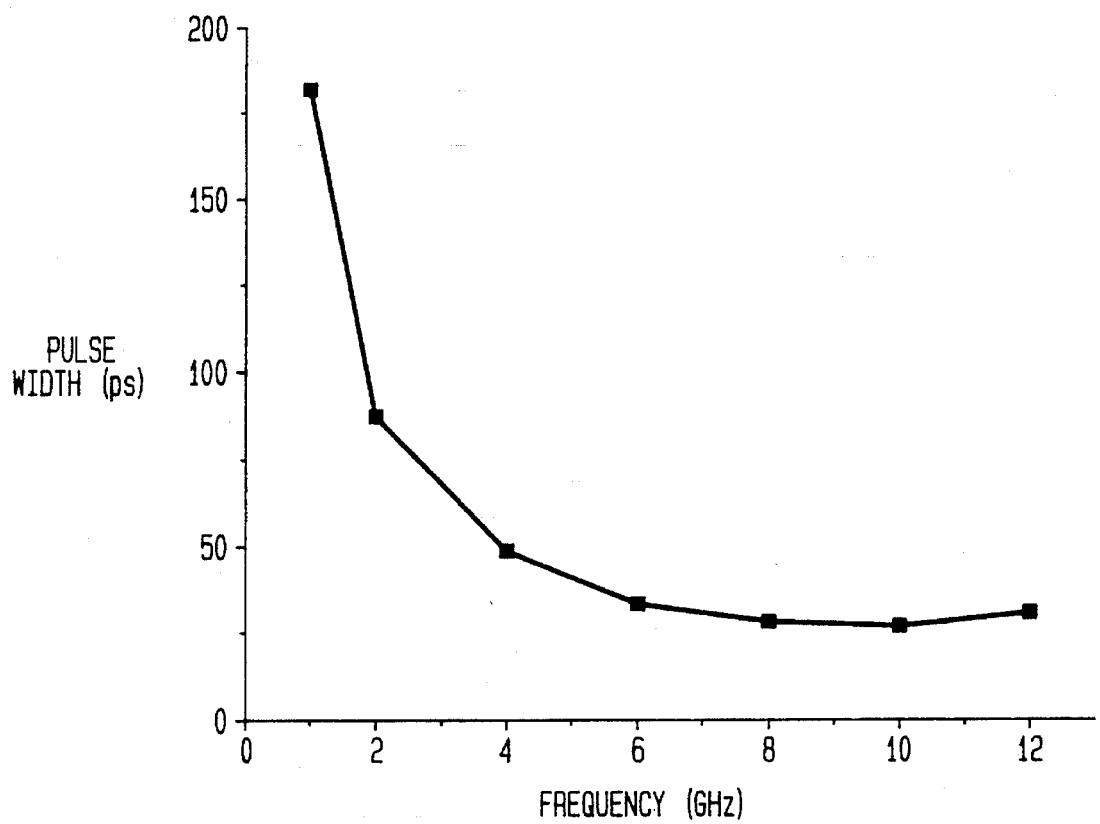
FIG. 3 shows a graph of the pulse width characteristics versus frequency of the modulator.

For illustrative purposes, the laser 10 is biased with a constant current of 65 mA and the modulator is biased as described above. FIG. 3 is a plot of the observed pulse width of the pulses output from the semiconductor device 100 at frequencies from 1 to 12 Ghz. At 10 Ghz, for example, the DC bias Vdc applied to the modulator 30 is −2.25 V and the RF power of the sinusoidal signal 120 is 27 dBm as measured into 50 ohms. The resultant pulse width is 25 ps with an on/off ratio of 17 dB and the spectral width is approximately 16 Ghz. The corresponding time-bandwidth product is 0.40.

Figure 4A:
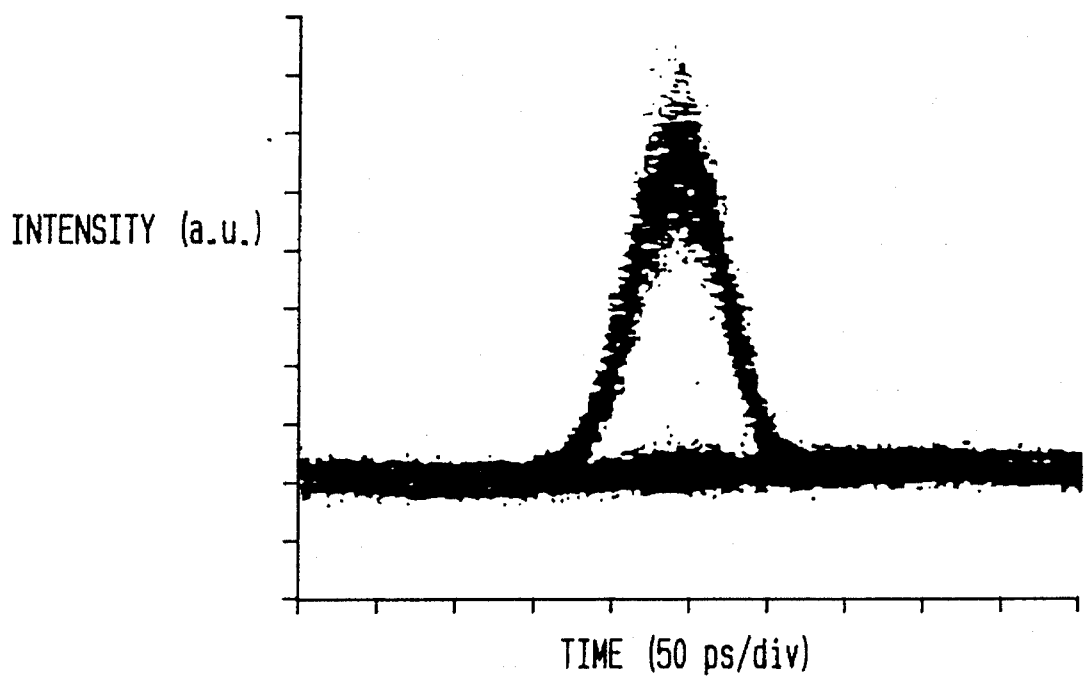
FIG. 4A shows an eye pattern of the optical pulse output of the semiconductor laser/modulator device and FIG. 4B shows the spectral waveshape of the optical outputs with and without digital encoding.

According to the first preferred embodiment of the present invention, the laser 10 is biased near threshold with Idc at 30 mA and is also directly encoded with digital data from data source 110. The data is applied to the laser contact with a peak to peak voltage of about 0.7 volts at, for example, 2.5 gigabits per second. The phase of the sinusoidal drive to the modulator 30 is optimized to align the bit period to the peak amplitude of the sine wave. FIG. 4A shows the RZ eye pattern observed on a sampling oscilloscope of a pseudo random data pulse train applied to laser 10. The laser chirp is minimized and narrow spectral characteristics are achieved by maintaining a relatively small modulation signal. The peak wavelength excursions are 0.4 angstrom.

Figure 4B:
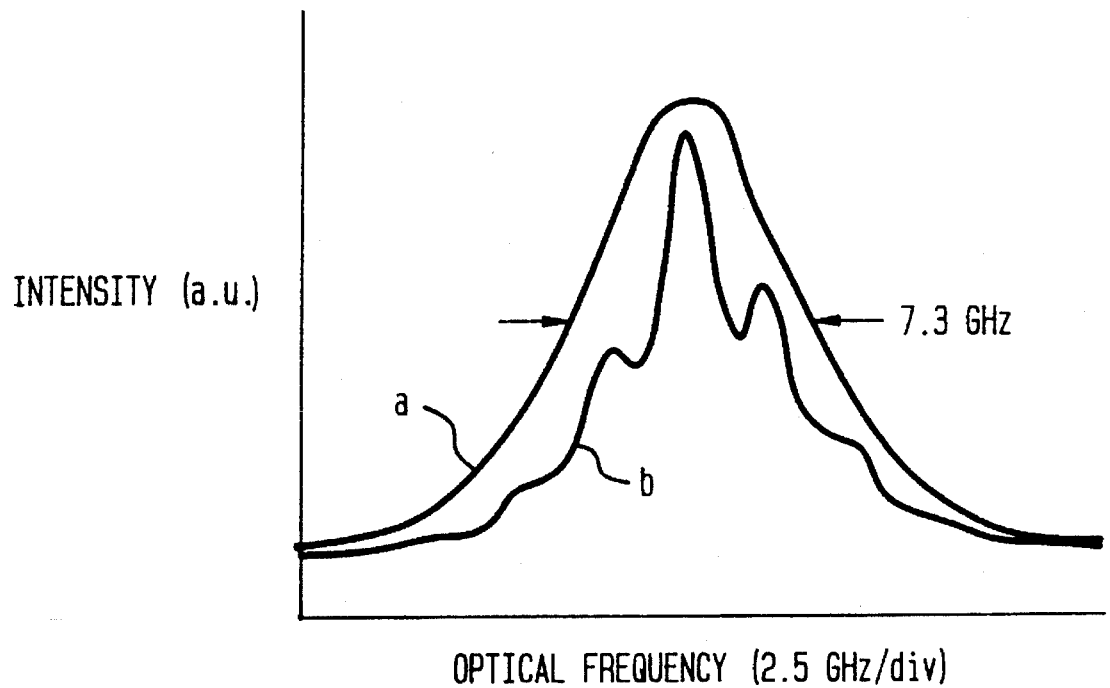

FIG. 4B shows the optical spectra of the two cases for pulses (a) with encoded data applied to the laser and (b) without encoded data applied to the laser.

As shown, there is approximately 25% broadening of the spectral width for the digitally encoded case (a). The estimated time bandwidth product broadens from 0.356 to 0.481.

Figure 5:
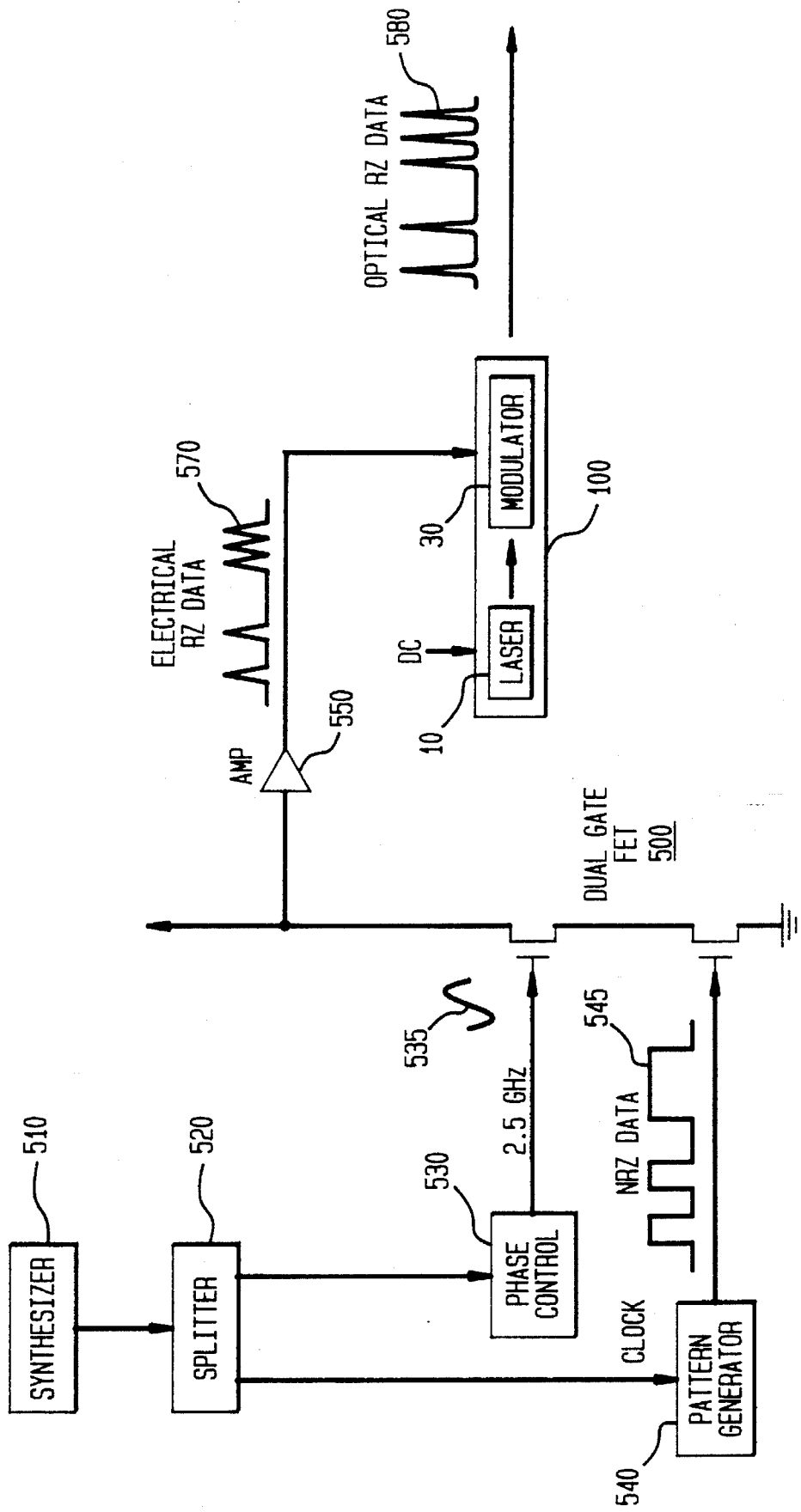
FIG. 5 is a schematic of the apparatus according to a second preferred embodiment of the present invention.

According to a second preferred embodiment, the laser-modulator device 100 produces optical RZ data with another biasing technique. Referring to FIG. 5, the laser 10 is biased at 60 mA to output a CW laser beam, which is then modulated by the modulator 30, which is in turn driven by a digital data signal 570 in RZ format, producing an optical RZ data 580 at the output of the laser-modulator device 100. The components used for producing the digital data signal 570 includes a dual-gate FET 500 for gating an NRZ data stream with an analog signal to produce an RZ format signal corresponding to the NRZ data. The gating process is similar to a logical "AND" operation. The dual gate FET may be any conventional dual gate field effect transistor capable of operating at high frequencies such as up to around 15 Ghz. It is apparent to one skilled in the art that any other transistor(s) configured as shown in FIG. 5 can accomplish the same function. The NRZ datastream input to the FET 500 is produced from pattern generator 540, a high speed data source which produces a preset data pattern in NRZ format at a bit rate corresponding to the rate of the clock input. The sinusoidal signal 535, in this case a 2.5 Ghz sinusoidal signal, is output from phase control 530. The 2.5 Ghz sinusoid and the clock for the pattern generator 540 originate from synthesizer 510, which is a 2.5 Ghz oscillator, the output of which is split by splitter 520. One of the outputs of the splitter is used as the clock input to the pattern generator 540 and the other splitter output is input to the phase control 530, which may be a variable delay line, or any equivalent, for adjusting the phase of the 2.5 Ghz sinusoid signal to coincide with the corresponding bit pattern period of the signal output from pattern generator 540. The dual gate FET 500 performs an AND operation of the NRZ data and the 2.5 Ghz sinusoidal inputs to produce an electrical data stream which is the same data input from the data generator but converted to an RZ format. The output of the FET is further amplified by amplifier 550 before it is used to drive the modulator 30 of the laser-modulator device 100.

As configured, the CW laser output of laser 10 is modulated by modulator 30 so that optical pulses are output when an electrical "one" is present to produce RZ optical pulses 580.

Figure 6:
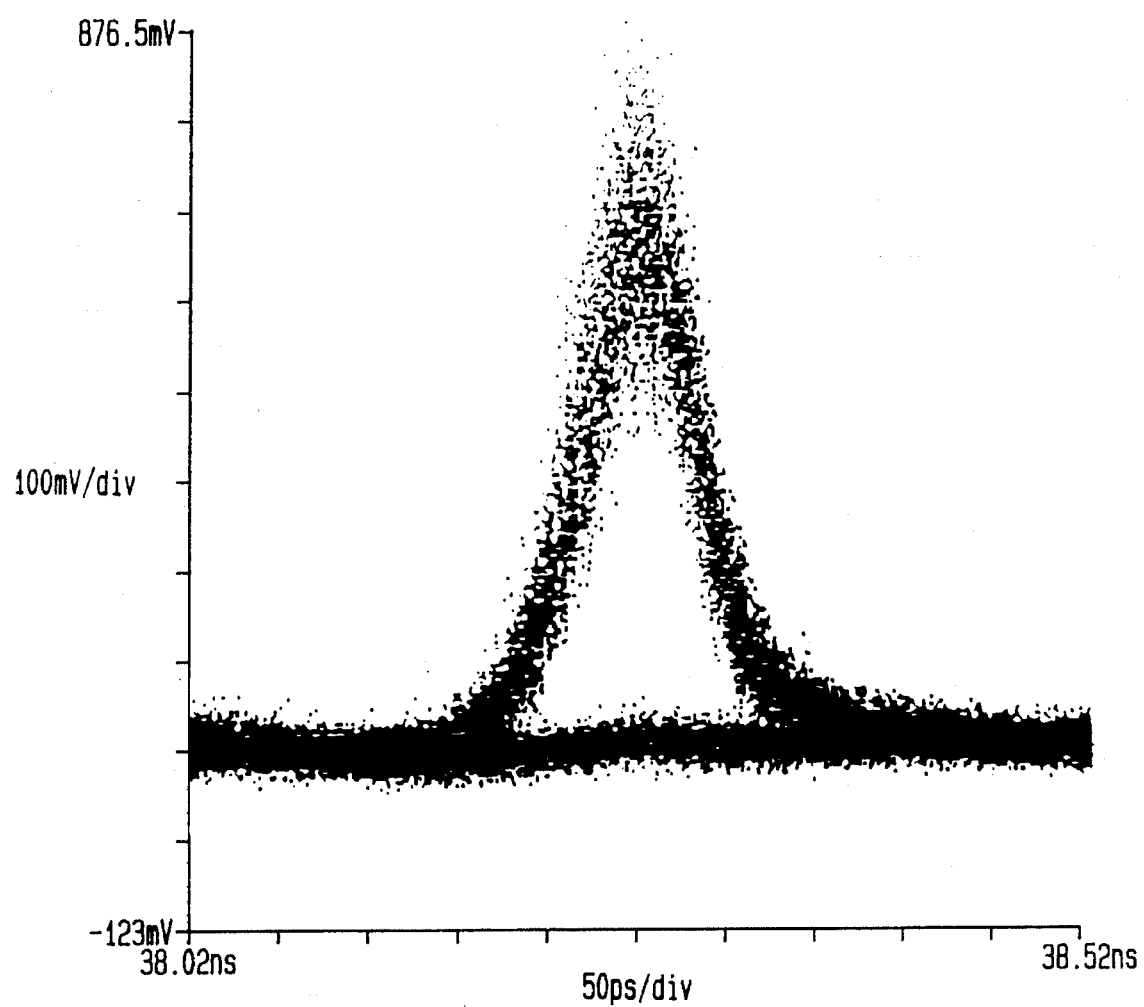
FIG. 6 shows an eye pattern of the optical pulse output of the semiconductor device according to the second preferred embodiment of the present invention.

FIG. 6 shows an eye pattern of the optical pulses output from the apparatus according to the second preferred embodiment of the present invention.

Figure 7A:
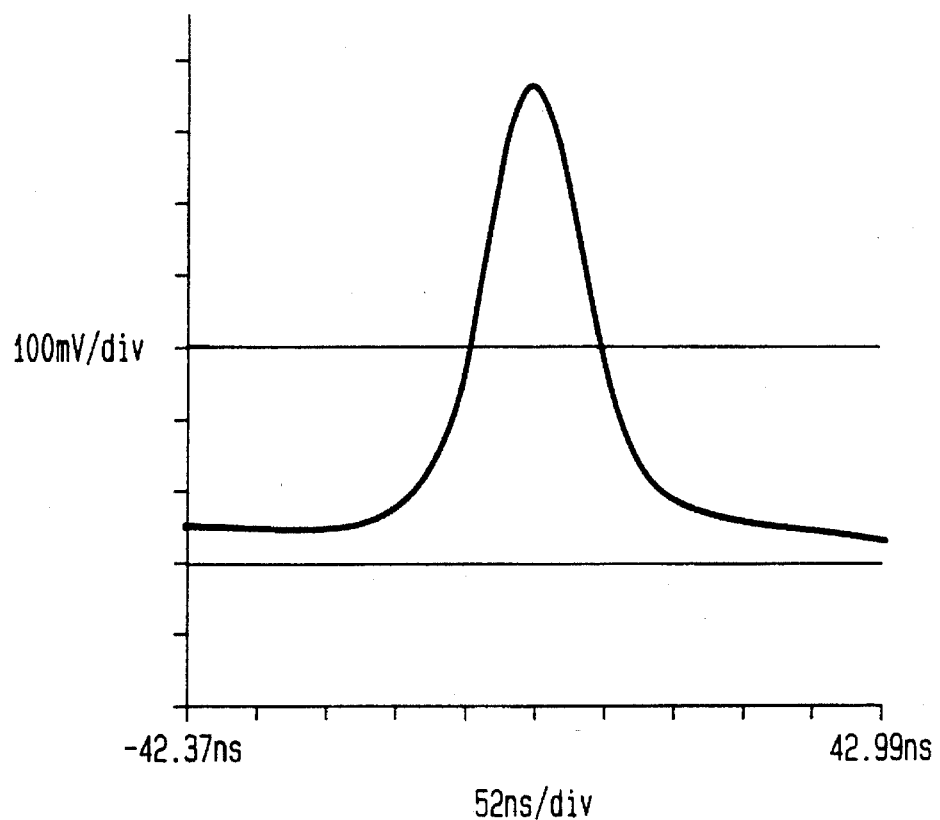
FIG. 7A shows a representative pulse of the optical output and FIG. 7B shows the corresponding spectrum.
Figure 7B:
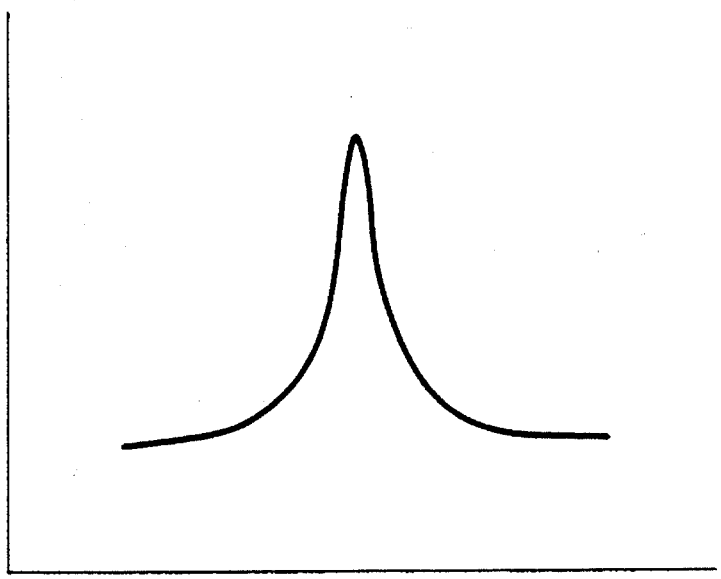

FIG. 7A and FIG. 7B show a representative output waveform and the corresponding spectrum, respectively.

Due to the non linear switching characteristics of the modulator, the optical output pulses are narrower than the input electrical pulses. The pulse width is 85 ps and could be further reduced by adding higher order harmonics to the electrical pulse shaping input. There is little or no chirp added by data encoding with the modulator.

Figure 8:
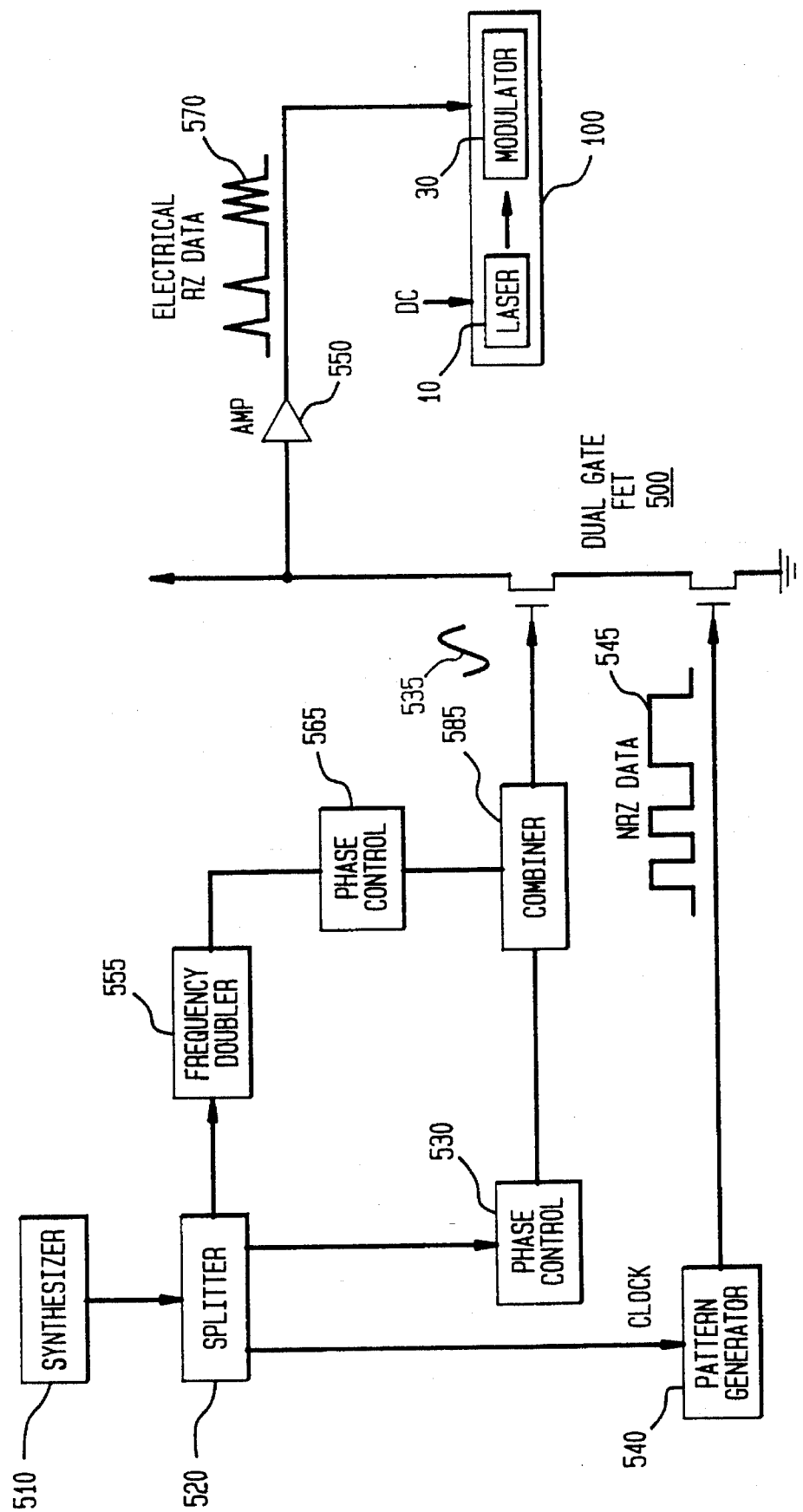
FIG. 8 is a schematic of the apparatus according to an alternative biasing arrangement to the embodiment as shown in FIG. 5.

FIG. 8 shows a technique for adding higher order harmonics to the electrical pulse shaping circuit. This technique produces an analog signal by superimposing sinusoidal signals which are harmonics of the oscillation signal originating from the synthesizer 510. The splitter 520 is a three way splitter (which may comprise two two-way splitters), with one output being the clock signal for the pattern generator 540, the second output being a first sinusoid signal and the third output being input to a frequency doubler 555 for creating the second harmonic of the first sinusoid. The output from the frequency doubler 555 may be phase adjusted by another phase controller 565 before being combined with the first sinusoid signal by combiner 585. The output of the combiner 585 is a superimposed, periodic analog signal 535 for inputting to the FET 500. It is readily apparent to one ordinary skilled in the art that a comb generator may be used in place of the frequency doubler arrangement to generate a short electrical pulse for shaping the electrical data.

The above description is illustrative of the application of the principles of the present invention. Modifications and other arrangements of the invention can be made by those skilled in the art without departing from the scope of the invention.

We claim:

1. An apparatus for producing encoded optical pulses for transmission in an optical communication system, comprising:

a semiconductor laser and a modulator, the laser for providing an optical source, the modulator for modulating the optical source;

means for biasing said laser to produce a CW optical output;

means for applying RZ electrical data pulses to said modulator to modulate said CW optical output to produce RZ optical data pulses corresponding to said RZ electrical data pulse, wherein said means for applying RZ electrical data pulses to said modulator includes a device for performing a gating operation of an NRZ data input with a periodic analog signal, said periodic analog signal being generated by superimposing harmonic related sinusoidal signals to provide electrical RZ data pulses.

2. The apparatus according to claim 1 wherein said device for performing a gating operation includes a dual gate FET.

3. The apparatus according to claim 1 wherein said analog signal is selectively variable in repetition rate.

4. The apparatus according to claim 1 wherein said apparatus outputs said encoded optical pulses at a selected wavelength and said semiconductor laser further includes means for varying said wavelength.

5. A method for generating soliton pulses from a laser and a modulator, comprising:

integrating said modulator with said laser onto a single semiconductor device;

biasing said laser for producing a CW laser output;

applying to said modulator an electrical RZ data signal for generating RZ optical data pulses corresponding to said RZ data signal and combining harmonically related sinusoidal signals for producing an analog periodic signal for gating with an NRZ data signal to produce said electrical RZ data signal.

6. A method according to claim 5, wherein said RZ data signal is generated by performing a gating operation of an NRZ data signal at a selected bit rate with an analog signal having a period substantially coinciding with said selected bit rate.

7. A method according to claim 6, further including the step of phase adjusting said analog signal for substantially time coinciding with said NRZ data signal for producing said electrical RZ data signal.

8. A method according to claim 5, wherein said electrical RZ data signal is produced by a dual gate FET.

* * * * *